(12) United States Patent
Okumura

(10) Patent No.: US 6,921,685 B2
(45) Date of Patent: Jul. 26, 2005

(54) METHOD OF FABRICATING THIN FILM TRANSISTOR

(75) Inventor: Hiroshi Okumura, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 10/119,164

(22) Filed: Apr. 9, 2002

(65) Prior Publication Data

US 2002/0192882 A1 Dec. 19, 2002

(30) Foreign Application Priority Data

Apr. 10, 2001 (JP) ........................................ 2001-111360

(51) Int. Cl.⁷ .............................................. H01L 21/00
(52) U.S. Cl. ...................... 438/149; 438/151; 438/160; 438/164; 438/166
(58) Field of Search ............................... 438/149, 151, 438/160, 164, 166, 197; 257/66, 72, 75

(56) References Cited

U.S. PATENT DOCUMENTS

| | | | | |
|---|---|---|---|---|
| 5,728,610 A | * | 3/1998 | Gosain et al. | 438/162 |
| 5,821,138 A | * | 10/1998 | Yamazaki et al. | 438/166 |
| 6,194,740 B1 | * | 2/2001 | Zhang et al. | 257/79 |
| 6,494,162 B1 | * | 12/2002 | Zhang et al. | 118/8 |
| 6,566,683 B1 | * | 5/2003 | Ogawa et al. | 257/53 |
| 2001/0010370 A1 | * | 8/2001 | Kimura et al. | 257/59 |

FOREIGN PATENT DOCUMENTS

| | | | |
|---|---|---|---|
| JP | 56-35407 | 4/1981 | |
| JP | 64-76715 | 3/1989 | |
| JP | 01241862 | * 9/1989 | ........... H01L/27/12 |
| JP | H09-139502 | 5/1997 | |
| JP | H11-103064 | 4/1999 | |
| JP | 11-103064 | 4/1999 | |
| KR | 1999-44046 | 6/1999 | |

* cited by examiner

Primary Examiner—Hsien-Ming Lee
(74) Attorney, Agent, or Firm—Choate, Hall & Stewart LLP

(57) ABSTRACT

A method of fabricating a thin film transistor includes the steps of (a) forming an amorphous silicon film containing hydrogen therein, on a substrate composed of resin, and (b) irradiating laser beams to the amorphous silicon film at an intensity equal to or smaller than a threshold intensity at which the amorphous silicon film is crystallized. For instance, the step (a) includes the steps of forming the amorphous silicon film on the resin substrate by sputtering, and doping hydrogen ions into the amorphous silicon film.

36 Claims, 3 Drawing Sheets

METHOD OF FABRICATING THIN FILM TRANSISTOR

BACKGROUND OF THE INVENTION

1. Field of the Invention

The invention relates to an active matrix substrate partially constituting a liquid crystal display device, and a method of fabricating the same.

2. Description of the Related Art

As an active matrix substrate partially constituting a liquid crystal display device, there is known an active matrix substrate including a thin film transistor composed of amorphous silicon, as a switching device.

In such an active matrix substrate, as disclosed in Japanese Unexamined Patent Publication No. 56-35407 (A), for instance, a thin film transistor composed of amorphous silicon is formed generally on a glass substrate.

However, since glass has a high specific gravity, an active matrix substrate including a glass substrate is relatively heavy.

In particular, since glass is readily broken, a glass substrate has to be formed to be thick, resulting that an active matrix substrate including such a glass substrate is unavoidably heavy.

These days, a liquid crystal display device is required to be light and thin, and hence, an active matrix substrate which is a part of a liquid crystal display device has to be fabricated lighter and thinner.

However, for the reasons mentioned above, there is limitation in fabricating a liquid crystal display device including a glass substrate, lighter and thinner.

Consequently, in order to fabricate a liquid crystal display device lighter and thinner, many attempts have been made to use a resin substrate in place of a glass substrate, because a resin substrate is lighter than a glass substrate and can be fabricated thinner than a glass substrate.

For instance, Japanese Unexamined Patent Publication No. 11-103064 (A) has suggested an active matrix substrate including a thin film transistor (TFT) as a switching device which thin film transistor is comprised of a thin polysilicon film formed on a resin substrate.

However, there is caused the problem mentioned below, if a thin film transistor comprised of an amorphous silicon film is formed on a resin substrate.

A currently used resin substrate generally has about 180 degrees centigrade as a maximum resistance to heat. When an amorphous silicon film is formed on a glass substrate through plasma-enhanced chemical vapor deposition (PECVD), an amorphous silicon film is formed generally at about 300 degrees centigrade which is over the maximum resistance of a resin substrate to heat. Accordingly, it is impossible to form an amorphous silicon film on a resin substrate through PECVD.

It would be possible to form an amorphous silicon film on a resin substrate through PECVD, if the amorphous film were formed at a temperature equal to or smaller than a maximum resistance of a resin substrate to heat, that is, equal to or smaller than 180 degrees centigrade. However, an amorphous silicon film having been formed through PECVD at 200 degrees centigrade or smaller would have a low density, a high hydrogen concentration, and an increased number of Si—$H_2$ bondings which are electrically unpreferable.

For instance, an amorphous silicon film formed through PECVD at about 300 degrees centigrade would include hydrogen making Si—H bonding by about $4\times10^{21}$ per cubic centimeter, and the number of Si—$H_2$ bondings is about forty times smaller or below than the number of Si—H bondings in such an amorphous silicon film.

In contrast, an amorphous silicon film formed through PECVD at 200 degrees centigrade would include hydrogen making Si—H bonding by about $7\times10^{21}$ per cubic centimeter, and the number of Si—$H_2$ bondings is greater or above than the number of Si—H bondings in such an amorphous silicon film.

As is obvious, an amorphous silicon film formed through PECVD at 200 degrees centigrade would include Si—$H_2$ bondings in greater number than an amorphous silicon film formed through PECVD at about 300 degrees centigrade.

An amorphous silicon film could be formed at a relatively small temperature by carrying out sputtering in hydrogen atmosphere. However, such an amorphous silicon film would include hydrogen in a small amount. In addition, hydrogen is not placed at a position where silicon used to exist, but placed at a position of an interstitial atom. As a result, a lot of dangling bonds remain as they are without being terminated with hydrogen.

As disclosed in the above-mentioned Japanese Unexamined Patent Publication No. 56-35407 (A), it would be possible to dope hydrogen ions into an amorphous silicon film having been formed by sputtering. However, it would be necessary to carry out annealing at 200 degrees centigrade or higher in order to bond the thus doped hydrogen ions with silicon.

As mentioned above, since a currently available resin substrate has about 180 degrees centigrade as a maximum resistance to heat, a resin substrate would be destroyed, if the resin substrate were annealed at 200 degrees centigrade or higher.

Another problem in annealing a resin substrate is that gas is discharged out of a resin substrate. In general, a resin substrate is pre-annealed at a temperature smaller than a maximum resistance of a resin substrate to heat for long time for discharging gas as much as possible.

However, it is impossible to discharge all gas out of a resin substrate by pre-annealing. A resin substrate absorbs humidity existing in the air after pre-annealing, or absorbs water each time in a wet process to be carried out in a photoresist step. As a result, a resin substrate will discharge gas again.

For the reasons mentioned above, an increase in the number of annealing a resin substrate has to be avoided.

For instance, Japanese Unexamined Patent Publication No. 64-76715 (A) has suggested a method of fabricating a thin film transistor, including the steps of forming a thin hydride amorphous semiconductor film containing silicon, on a glass substrate, and irradiating ultra-violet laser beams to the thin hydride amorphous semiconductor film. The laser beams have an intensity profile which is longitudinally uniform, and latitudinally trapezoidal. The laser beams are irradiated to the semiconductor film by scanning the semiconductor film with the laser beams.

However, the above-mentioned problems remain unsolved even in the Publication.

SUMMARY OF THE INVENTION

In view of the above-mentioned problems in the conventional thin film transistors, it is an object of the present invention to provide a method of fabricating a thin film transistor which method is capable of fabricating a thin film transistor comprised of an amorphous silicon film formed on a resin substrate, without carrying out annealing at a temperature equal to or higher than a maximum resistance of a resin substrate to heat.

In one aspect of the present invention, there is provided a method of fabricating a thin film transistor, including the steps of (a) forming an amorphous silicon film containing hydrogen therein, on a substrate composed of resin, and (b) irradiating laser beams to the amorphous silicon film at an intensity equal to or smaller than a threshold intensity at which the amorphous silicon film is crystallized.

There is further provided a method of fabricating a thin film transistor, including the steps of (a) forming an amorphous silicon film containing hydrogen therein, on a substrate composed of resin, and (b) applying an electric field to the amorphous silicon film.

In the method in accordance with the present invention, laser beams are irradiated to an amorphous silicon film, and an electric field is applied to an amorphous silicon film both without necessity of thermal energy. That is, both of those steps can be carried out at room temperature. Accordingly, a resin substrate having a low maximum resistance to heat will never experience a temperature equal to or higher than the maximum resistance to heat, ensuring that a thin film transistor comprised of an amorphous silicon film can be formed on a resin substrate.

For instance, the step (a) may be designed to include the steps of (a1) forming the amorphous silicon film on the resin substrate by sputtering, and (a2) doping hydrogen ions into the amorphous silicon film.

It is preferable that laser beams are irradiated to the amorphous silicon film at an intensity equal to or greater than 70% of the threshold intensity in the step (b).

There is further provided a method of fabricating a thin film transistor, including the steps of (a) forming an electrically insulating film on a substrate composed of resin, (b) forming a gate electrode on the electrically insulating film, (c) forming a gate insulating film on the electrically insulating film such that the gate electrode is entirely covered with the gate insulating film, (d) forming a first amorphous silicon film on the gate insulating film, (e) forming a channel-protection film on the first amorphous silicon film, (f) irradiating laser beams to the first amorphous silicon film through the channel-protection film, (g) pattering the channel-protection film into an island, (h) forming a second amorphous silicon film on the first amorphous silicon film such that the channel-protection film is entirely covered with the second amorphous silicon film, the second amorphous silicon film containing impurity therein, (i) patterning the second amorphous silicon film, the first amorphous silicon film and the gate insulating film into an island, (j) forming a metal wiring layer around the second amorphous silicon film, the first amorphous silicon film and the gate insulating film such that the thus island-shaped second amorphous silicon film is partially exposed, (k) partially removing the second amorphous silicon film with the metal wiring layer being used as a mask, to thereby expose the channel-protection film, (l) forming an interlayer insulating film all over a product resulted from the step (k), (m) forming the interlayer insulating film with a contact hole reaching the metal wiring layer, and (n) forming a metal film on the interlayer insulating film such that the contact hole is filled with the metal film, the metal film defining a pixel electrode.

There is further provided a method of fabricating a thin film transistor, including the steps of (a) forming an electrically insulating film on a substrate composed of resin, (b) forming a gate electrode on the electrically insulating film, (c) forming a gate insulating film on the electrically insulating film such that the gate electrode is entirely covered with the gate insulating film, (d) forming a first amorphous silicon film on the gate insulating film, (e) introducing hydrogen into the first amorphous silicon film, (f) doping impurity into the first amorphous silicon film in a selected region to thereby form an impurity-doped region, (g) irradiating laser beams to the first amorphous silicon film, (h) pattering the first amorphous silicon film into an island such that the island includes the impurity-doped region, (i) forming a metal wiring layer such that the metal wiring layer makes contact with the first amorphous silicon film, (j) forming an interlayer insulating film all over a product resulted from the step (i), (k) forming the interlayer insulating film with a contact hole reaching the metal wiring layer, and (l) forming a metal film on the interlayer insulating film such that the contact hole is filled with the metal film, the metal film defining a pixel electrode.

There is further provided a method of fabricating a thin film transistor, including the steps of (a) forming an electrically insulating film on a substrate composed of resin, (b) forming a gate electrode on the electrically insulating film, (c) forming a gate insulating film on the electrically insulating film such that the gate electrode is entirely covered with the gate insulating film, (d) forming a first amorphous silicon film on the gate insulating film, (e) introducing hydrogen into the first amorphous silicon film, (f) doping impurity into the first amorphous silicon film in a selected region to thereby form an impurity-doped region, (g) pattering the first amorphous silicon film into an island such that the island includes the impurity-doped region, (h) forming a metal wiring layer such that the metal wiring layer makes contact with the first amorphous silicon film, (i) forming an interlayer insulating film all over a product resulted from the step (h), (j) forming the interlayer insulating film with a contact hole reaching the metal wiring layer, (k) forming a metal film on the interlayer insulating film such that the contact hole is filled with the metal film, the metal film defining a pixel electrode, and (l) applying an electric field across an impurity-doped region which will make a source of the thin film transistor and an impurity-doped region which will make a drain of the thin film transistor.

There is further provided a method of fabricating a liquid crystal display device including a thin film transistor fabricated in accordance with the method as defined above.

In another aspect of the present invention, there is provided a liquid crystal display device including a thin film transistor fabricated in accordance with the method as defined above.

The advantages obtained by the aforementioned present invention will be described hereinbelow.

In the method in accordance with the present invention, a thin film transistor is formed on a resin substrate through steps which are able to be carried out at room temperature without thermal energy. For instance, laser beams are irradiated to an amorphous silicon film, or an electric field is applied to an amorphous silicon film, in order to fabricate a thin film transistor. Accordingly, a resin substrate having a low maximum resistance to heat will never experience a temperature equal to or higher than the maximum resistance to heat. Thus, the method of fabricating a thin film transistor, in accordance with the present invention, it is possible to fabricate a thin film transistor on a resin substrate which transistor is comprised of an amorphous silicon film having electrically superior characteristics.

In addition, it would be possible to fabricate a liquid crystal display device lighter and thinner by applying a thin film transistor fabricated in accordance with the above-mentioned method, to a liquid crystal display device.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

FIGS. 1A to 1I illustrate respective steps of a method of fabricating a thin film transistor, in accordance with the first embodiment. Hereinbelow is explained a method of fabricating a thin film transistor, in accordance with the first embodiment, with reference to FIGS. 1A to 1I.

Figure 1A:
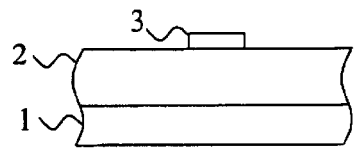
FIGS. 1A to 1I are cross-sectional views of a thin film transistor, illustrating respective steps of a method of fabricating a thin film transistor, in accordance with the first embodiment of the present invention.

First, as illustrated in FIG. 1A, a silicon dioxide film 2 is formed as a cover film by sputtering on a resin substrate 1 composed of polyimide (PI) having a maximum resistance to heat of about 220 degrees centigrade. The silicon dioxide film 2 has a thickness of 2000 angstroms.

Then, a chromium film is formed entirely over the silicon dioxide film 2.

Then, photoresist is coated all over the chromium film, and then, the photoresist is patterned by photolithography to thereby form a mask (not illustrated). Then, the chromium film is patterned by dry etching into an island through the mask to thereby form a gate electrode 3 on the silicon dioxide film 2, as illustrated in FIG. 1A.

Figure 1B:
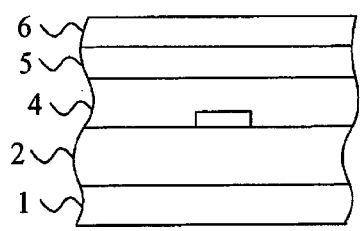

Then, as illustrated in FIG. 1B, a gate insulating film 4 composed of silicon nitride is formed by plasma-enhanced chemical vapor deposition (PECVD) on the silicon dioxide film 2 such that the gate electrode 3 is covered entirely with the gate insulating film 4. Then, an amorphous silicon film 5 as an active layer is formed on the gate insulating film 4 by PECVD. Then, a channel-protection film 6 composed of silicon nitride is formed on the amorphous silicon film 5 by PECVD. The gate insulating film 4, the amorphous silicon film 5 and the channel-protection film 6 are all formed at 200 degrees centigrade. The gate insulating film 4, the amorphous silicon film 5 and the channel-protection film 6 have thicknesses of 4000, 1000 and 1000 angstroms, respectively.

Figure 1C:
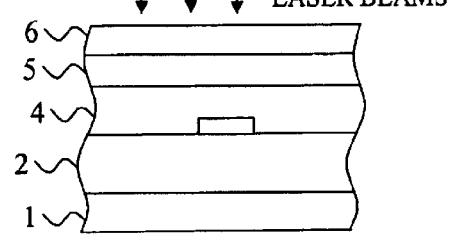

Then, as illustrated in FIG. 1C, excimer laser beams are irradiated to the amorphous silicon film 5 through the channel-protection film 6.

The conditions for irradiating the excimer laser beams to the amorphous silicon film 5 are as follows.

Light source: XeCl
Energy density: 270 mJ/cm$^2$
Beam diameter: 250×0.4 mm
Pitch of scanning irradiation: 0.04 mm A hydrogen concentration in the amorphous silicon film 5 is reduced to 10% from 14% by virtue of the laser beam irradiation, and a ratio of Si—H bondings in the contained hydrogen is increased up to 90% from 78%.

In the irradiation of the laser beams to the amorphous silicon film 5 in the step illustrated in FIG. 1C, the laser beams were designed to have an energy density of 300 mJ/cm$^2$. As a result, the amorphous silicon film 5 was crystallized into a polysilicon film.

In view of this result, the inventor had conducted an experiment in order to find an appropriate range of an energy density of the laser beams. In the experiment, the laser beams having various energy densities were irradiated to the amorphous silicon film 5, and it was observed as to whether the amorphous silicon film 5 was crystallized at each of the energy densities, and further how a hydrogen concentration varied was monitored.

The results of the experiment were shown in Table 1.

TABLE 1

| Energy Density [mJ/cm$^2$] | Crystallized ? | Hydrogen Concentration [%] |
| --- | --- | --- |
| 190 | NO | 14→12 |
| 200 | NO | 14→12 |
| 210 | NO | 14→10.5 |
| 220 | NO | 14→10.5 |
| 230 | NO | 14→10.5 |
| 240 | NO | 14→10 |
| 250 | NO | 14→10 |
| 260 | NO | 14→10 |
| 270 | NO | 14→10 |
| 280 | NO | 14→9.5 |
| 290 | NO | 14→3 |
| 300 | YES | |

As is obvious in view of the results shown in Table 1, it was found out that a threshold energy density of laser beams at which the amorphous silicon film 5 was crystallized is 300 mJ/cm$^2$.

In addition, it was also found out that it is preferable to irradiate laser beams to the amorphous silicon film 5 which laser beams have an energy density of 70% or greater of the threshold energy density, that is, an energy density of 210 mJ/cm$^2$ or greater in order to reduce a hydrogen concentration of the amorphous silicon film 5.

It was also found out that if the laser beams having an energy density of 210 mJ/cm$^2$ or greater were irradiated to the amorphous silicon film 5, a resultant thin film transistor including the amorphous silicon film 5 would have enhanced reliability. This is considered because that the laser beams exerted influence on a region from a surface of the amorphous silicon film 5 (a-Si) to an interface between the amorphous silicon film 5 and the gate insulating film 4 (SiN), resulting in that the interface was reformed.

A hydrogen concentration is significantly reduced in the vicinity of the threshold energy density. Accordingly, it is preferable that the laser beams have an energy density in the range of about 70% to about 95% of the threshold energy density.

It should be noted that the above-mentioned threshold energy density is dependent on process conditions including, for instance, a thickness of the amorphous silicon film 5, a wavelength of laser beams and a pulse width of laser beams.

Figure 1D:
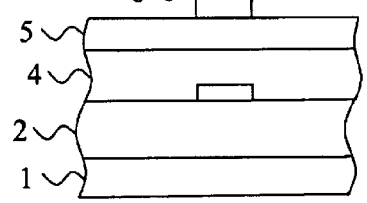

Then, photoresist is coated all over the channel-protection film 6, and then, the photoresist is patterned by photolithography and etching to thereby form a mask (not illustrated). Then, the channel-protection film 6 is patterned by dry etching into an island through the mask, as illustrated in FIG. 1D.

After removal of the mask, an n-type electrically conductive amorphous silicon film 7 is formed on the amorphous silicon film 5 at 200 degrees centigrade by PECVD such that the island-shaped channel-protection film 6 is covered entirely with the n-type electrically conductive amorphous silicon film 7.

Figure 1E:
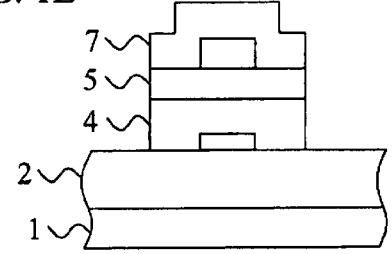

Then, photoresist is coated all over the n-type electrically conductive amorphous silicon film 7, and then, the photoresist is patterned by photolithography and etching to thereby form a mask (not illustrated). Then, the n-type electrically conductive amorphous silicon film 7, the amorphous silicon film 5 and the gate insulating film are patterned by dry etching into an island through the mask, as illustrated in FIG. 1E.

After removal of the mask, a chromium film is formed by sputtering all over a resultant resulted from the above-mentioned steps.

Figure 1F:
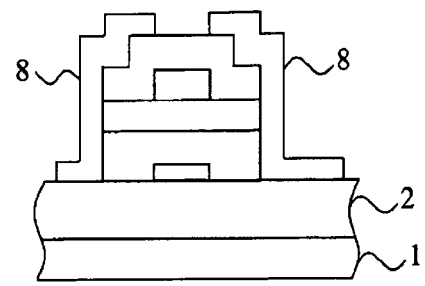

Then, photoresist is coated all over the chromium film, and then, the photoresist is patterned by photolithography and etching to thereby form a mask (not illustrated). Then, the chromium film is patterned by dry etching through the mask to thereby form a metal wiring layer 8 having an opening above the island-shaped channel-protection film 6, as illustrated in FIG. 1F.

Figure 1G:
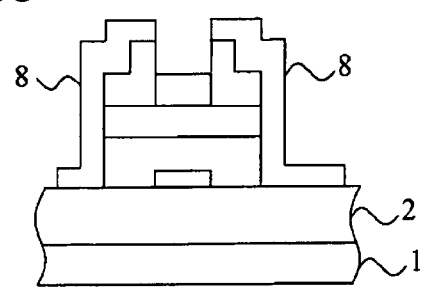

Then, as illustrated in FIG. 1G, the n-type electrically conductive amorphous silicon film 7 is partially removed by dry etching above the island-shaped channel-protection film 6 through the use of the metal wiring layer 8 as a mask.

Then, an interlayer insulating film 9 composed of silicon nitride is formed all over the product resulted from the above-mentioned steps, by PECVD.

Figure 1H:
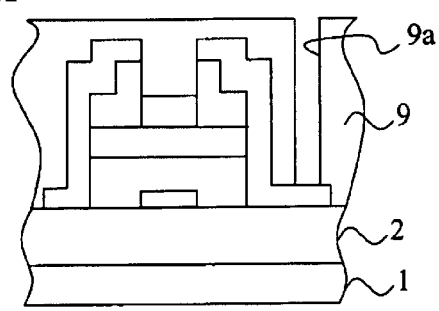

Then, photoresist is coated all over the interlayer insulating film 9, and then, the photoresist is patterned by photolithography and etching to thereby form a mask (not illustrated). Then, the interlayer insulating film 9 is patterned by dry etching through the mask to thereby form a contact hole 9a reaching the metal wiring layer 8, as illustrated in FIG. 1H.

Then, an electrically conductive film composed of electrically conductive transparent material such as indium-tin-oxide (ITO) is formed over the interlayer insulating film 9 by sputtering such that the contact hole 9a is filled with the electrically conductive film.

Figure 1I:
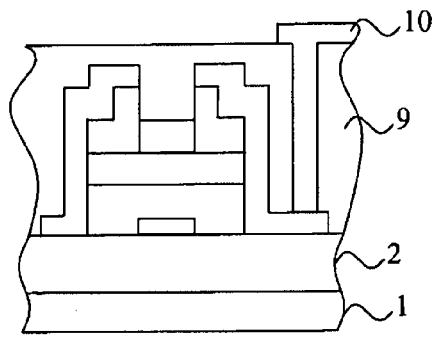

Then, photoresist is coated all over the electrically conductive transparent film, and then, the photoresist is patterned by photolithography and etching to thereby form a mask (not illustrated). Then, the electrically conductive transparent film is patterned by dry etching through the mask to thereby form a pixel electrode 10, as illustrated in FIG. 1I.

Then, a product resulted from the above-mentioned steps is annealed for an hour at 200 degrees centigrade in order to reduce a contact resistance.

Thus, a channel-protection type thin film transistor composed of amorphous silicon having superior electric characteristics is formed on the resin substrate 1.

The thus fabricated thin film transistor had mobility of 0.7 cm$^2$/Vs

In order to confirm the advantageous effect provided by irradiating laser beams to the amorphous silicon film 5, the inventor conducted the experiment in which there was fabricated a thin film transistor as a reference transistor in accordance with the above-mentioned method without carrying out the step of irradiating laser beams to the amorphous silicon film 5, having been explained with reference to FIG. 1D.

The reference transistor had mobility of 0.1 cm$^2$/Vs, which is seven times smaller than the mobility of the thin film transistor fabricated in accordance with the first embodiment. It was confirmed by the experiment that the thin film transistor in accordance with the first embodiment provided enhanced performance.

[Second Embodiment]

FIGS. 2A to 2I illustrate respective steps of a method of fabricating a thin film transistor, in accordance with the second embodiment. Hereinbelow is explained a method of fabricating a thin film transistor, in accordance with the second embodiment, with reference to FIGS. 2A to 2I.

Figure 2A:
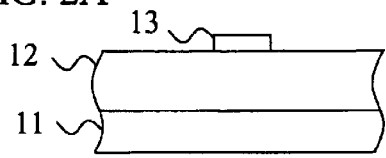
FIGS. 2A to 2I are cross-sectional views of a thin film transistor, illustrating respective steps of a method of fabricating a thin film transistor, in accordance with the second embodiment of the present invention.

First, as illustrated in FIG. 2A, a silicon dioxide film 12 is formed as a cover film by sputtering on a resin substrate 11 composed of polyethersulfon (PES).

Then, a chromium film is formed entirely over the silicon dioxide film 12.

Then, photoresist is coated all over the chromium film, and then, the photoresist is patterned by photolithography to thereby form a mask (not illustrated). Then, the chromium film is patterned by dry etching into an island through the mask to thereby form a gate electrode 13 on the silicon dioxide film 12, as illustrated in FIG. 2A.

Figure 2B:
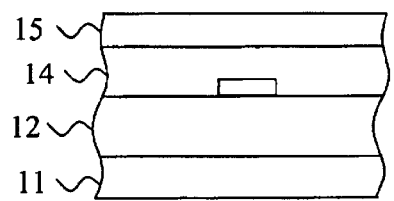

Then, as illustrated in FIG. 2B, a gate insulating film 14 composed of silicon nitride is formed by sputtering on the silicon dioxide film 12 such that the gate electrode 13 is covered entirely with the gate insulating film 14. Then, an amorphous silicon film 15 as an active layer is formed on the gate insulating film 14 by sputtering.

Figure 2C:
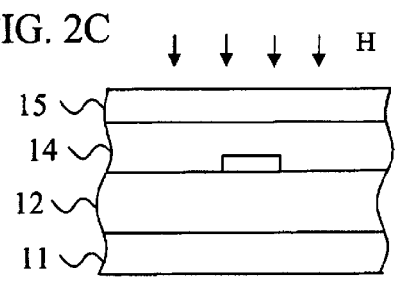

Then, as illustrated in FIG. 2C, hydrogen ions are doped into the amorphous silicon film 15. By carrying out such ion-doping, hydrogen ions are introduced not only into the amorphous silicon film 15, but also into the gate insulating film 14 formed immediately below the amorphous silicon film 15.

Figure 2D:
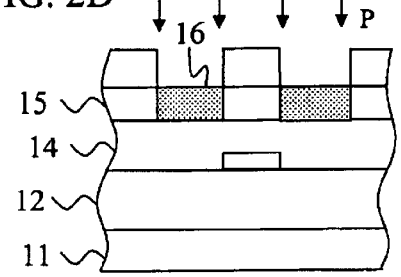

Then, photoresist is coated all over the amorphous silicon film 15, and then, the photoresist is patterned by photolithography to thereby form a mask (not illustrated). Then, phosphorus (P) ions are doped into the amorphous silicon film 15 through the mask to form n-type impurity regions 16 in the amorphous silicon film 15, as illustrated in FIG. 2D.

The impurity regions 16 may be formed by ion-implantation in place of ion-doping.

Figure 2E:
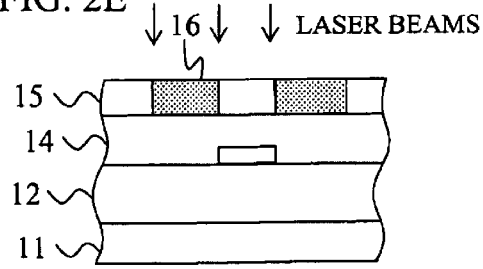

After removal of the mask, as illustrated in FIG. 2E, excimer laser beams are irradiated to the amorphous silicon film 15 including the impurity regions 16.

Figure 2F:
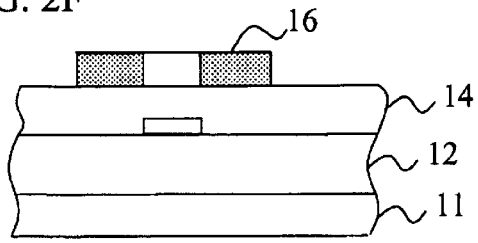

Then, photoresist is coated all over the amorphous silicon film 15, and then, the photoresist is patterned by photolithography to thereby form a mask (not illustrated). Then, the amorphous silicon film 15 is patterned by dry etching into an island through the mask such that the island includes the impurity regions 16, as illustrated in FIG. 2F.

Then, a chromium film is formed entirely over the product resulted from the above-mentioned steps.

Figure 2G:
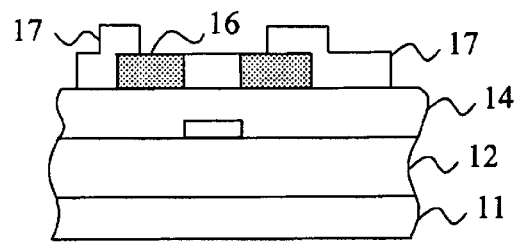

Then, photoresist is coated all over the chromium film, and then, the photoresist is patterned by photolithography to thereby form a mask (not illustrated). Then, the chromium film is patterned by dry etching through the mask to thereby form a metal wiring layer 17 through which the island-shaped amorphous silicon film 15 is exposed at its upper surface, as illustrated in FIG. 2G.

Then, an interlayer insulating film 18 composed of silicon dioxide is formed all over the product resulted from the above-mentioned steps, by sputtering.

Figure 2H:
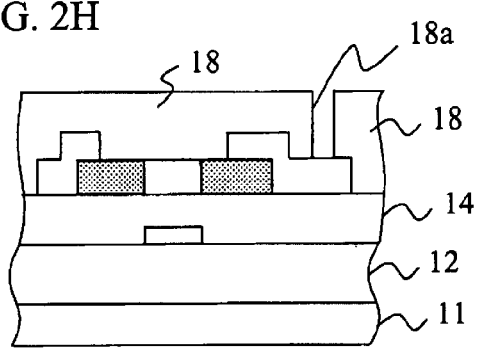

Then, photoresist is coated all over the interlayer insulating film 18, and then, the photoresist is patterned by photolithography and etching to thereby form a mask (not illustrated). Then, the interlayer insulating film 18 is patterned by dry etching through the mask to thereby form a contact hole 18a reaching the metal wiring layer 17, as illustrated in FIG. 2H.

Then, an electrically conductive film composed of electrically conductive transparent material such as indium-tin-oxide (ITO) is formed over the interlayer insulating film 18 by sputtering such that the contact hole 18a is filled with the electrically conductive film.

Figure 2I:
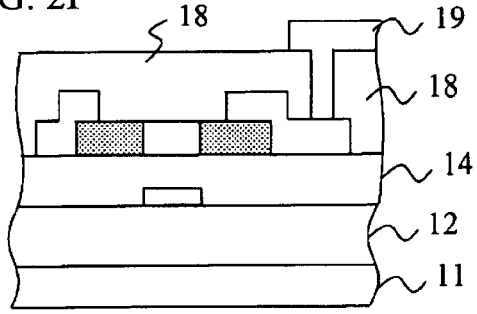

Then, photoresist is coated all over the electrically conductive transparent film, and then, the photoresist is patterned by photolithography and etching to thereby form a mask (not illustrated). Then, the electrically conductive transparent film is patterned by dry etching through the mask to thereby form a pixel electrode 19, as illustrated in FIG. 2I.

Then, a product resulted from the above-mentioned steps is annealed in order to reduce a contact resistance.

Thus, a coplanar type thin film transistor composed of amorphous silicon having superior electric characteristics is formed on the resin substrate 11.

Then, an example of the method in accordance with the second embodiment is explained hereinbelow.

First, as illustrated in FIG. 2A, a silicon dioxide film 12 is formed as a cover film by sputtering on a resin substrate 11 composed of polyethersulfon (PES) having a maximum resistance to heat of about 180 degrees centigrade. The silicon dioxide film 12 has a thickness of 2000 angstroms.

Then, a chromium film is formed entirely over the silicon dioxide film 12.

Then, the chromium film is patterned by photolithography and dry etching into an island-shaped gate electrode 13, as illustrated in FIG. 2A.

Then, as illustrated in FIG. 2B, a gate insulating film 14 composed of silicon nitride and an amorphous silicon film 15 as an active layer are successively formed on the silicon dioxide film 12 at 180 degrees centigrade by sputtering. The gate insulating film 14 and the amorphous silicon film 15 have thicknesses of 4500 and 800 angstroms, respectively.

Then, as illustrated in FIG. 2C, hydrogen ions are doped into the amorphous silicon film 15.

The conditions for carrying out the hydrogen-ion-doping are as follows.

Acceleration voltage: 40 KeV
Doped hydrogen: $5 \times 10^{16}$ cm$^{-2}$

Then, a mask is formed on the amorphous silicon film 15. Then, phosphorus (P) ions are doped into the amorphous silicon film 15 through the mask to form n-type impurity regions 16 in the amorphous silicon film 15, as illustrated in FIG. 2D.

The conditions for carrying out the phosphorus-ion-doping are as follows in order to allow phosphorus to be introduced only into the amorphous silicon film 15.

Acceleration voltage: 20 KeV
Doped phosphorus: $2 \times 10^{15}$ cm$^{-2}$

After removal of the mask, as illustrated in FIG. 2E, excimer laser beams are irradiated to the amorphous silicon film 15 including the impurity regions 16.

The conditions for irradiating the excimer laser beams to the amorphous silicon film 15 are as follows.

Light source: XeCl
Energy density: 180 mJ/cm$^2$
Beam diameter: 250×0.4 mm
Pitch of scanning irradiation: 0.04 mm The amorphous silicon film 15 had a hydrogen concentration of 10% after the irradiation of the laser beams thereto. A ratio of Si—H bondings in the contained hydrogen was equal to or greater than 90%.

An energy density of the laser beams at which the amorphous silicon film 15 was crystallized in the above-mentioned conditions was 210 mJ/cm$^2$.

Then, the amorphous silicon film 15 including the impurity regions 16 is patterned into an island, as illustrated in FIG. 2F.

Then, a chromium film is formed by sputtering entirely over the product resulted from the above-mentioned steps.

Then, the chromium film is patterned by dry etching to thereby form a metal wiring layer 17 through which the island-shaped amorphous silicon film 15 is exposed at its upper surface, as illustrated in FIG. 2G.

Then, an interlayer insulating film 18 composed of silicon dioxide is formed all over the product resulted from the above-mentioned steps, by sputtering.

Then, the interlayer insulating film 18 is patterned by dry etching to thereby form a contact hole 18a reaching the metal wiring layer 17, as illustrated in FIG. 2H.

Then, an electrically conductive film composed of electrically conductive transparent material such as indium-tin-oxide (ITO) is formed over the interlayer insulating film 18 by sputtering such that the contact hole 18a is filled with the electrically conductive film.

Then, the electrically conductive transparent film is patterned by dry etching to thereby form a pixel electrode 19, as illustrated in FIG. 2I.

Then, the product resulted from the above-mentioned steps is annealed for an hour at 160 degrees centigrade in order to reduce a contact resistance.

Thus, a coplanar type thin film transistor composed of amorphous silicon having superior electric characteristics is formed on the resin substrate 11.

In order to confirm the advantageous effect provided by irradiating laser beams to the amorphous silicon film 15, the inventor conducted the experiment in which there was fabricated a thin film transistor as a reference transistor in accordance with the above-mentioned method without carrying out the step of irradiating laser beams to the amorphous silicon film 15, having been explained with reference to FIG. 2E.

The thin film transistor fabricated through the method in accordance with the second embodiment worked well. However, the reference transistor did not work. Thus, it was confirmed by the experiment that the thin film transistor in accordance with the second embodiment provided enhanced performance.

[Third Embodiment]

FIGS. 3A to 3I illustrate respective steps of a method of fabricating a thin film transistor, in accordance with the third embodiment. Hereinbelow is explained a method of fabricating a thin film transistor, in accordance with the third embodiment, with reference to FIGS. 3A to 3I.

Figure 3A:
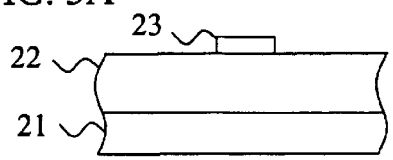
FIGS. 3A to 3I are cross-sectional views of a thin film transistor, illustrating respective steps of a method of fabricating a thin film transistor, in accordance with the third embodiment of the present invention.

First, as illustrated in FIG. 3A, a silicon dioxide film 22 is formed as a cover film by sputtering on a resin substrate 21 composed of siloxane having a maximum resistance of about 250 degrees centigrade to heat.

Then, a chromium film is formed entirely over the silicon dioxide film 22.

Then, photoresist is coated all over the chromium film, and then, the photoresist is patterned by photolithography to thereby form a mask (not illustrated). Then, the chromium film is patterned by dry etching into an island through the mask to thereby form a gate electrode 23 on the silicon dioxide film 22, as illustrated in FIG. 3A.

Figure 3B:
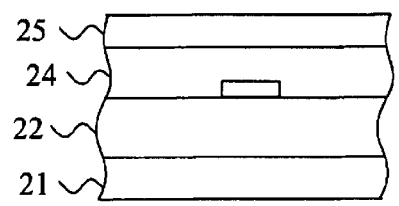

Then, as illustrated in FIG. 3B, a gate insulating film 24 composed of silicon nitride is formed by sputtering on the silicon dioxide film 22 such that the gate electrode 23 is covered entirely with the gate insulating film 24. Then, an amorphous silicon film 25 as an active layer is formed on the gate insulating film 24 by sputtering. The gate insulating film 24 and the amorphous silicon film 25 are successively formed.

Figure 3C:
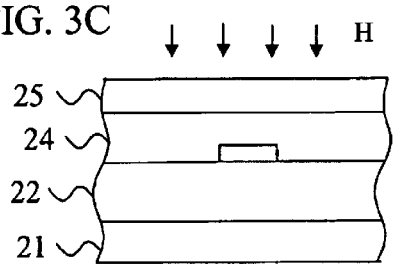

Then, as illustrated in FIG. 3C, hydrogen ions are doped entirely into the amorphous silicon film 25. By carrying out such ion-doping, hydrogen ions are introduced not only into the amorphous silicon film 25, but also into the gate insulating film 24 formed immediately below the amorphous silicon film 25.

Figure 3D:
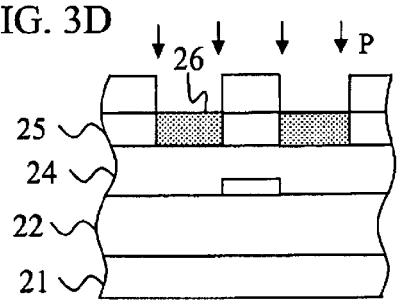

Then, photoresist is coated all over the amorphous silicon film 25, and then, the photoresist is patterned by photolithography to thereby form a mask. Then, phosphorus (P) ions are doped into the amorphous silicon film 25 through the mask to form n-type impurity regions 26 in the amorphous silicon film 25, as illustrated in FIG. 3D.

Figure 3E:
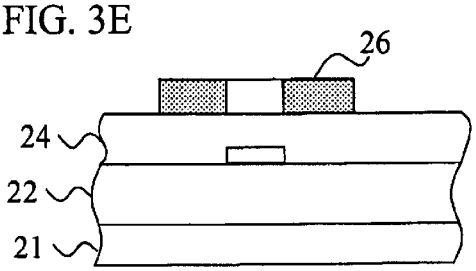

After removal of the photoresist, another photoresist is coated all over the amorphous silicon film 25, and then, the photoresist is patterned by photolithography to thereby form a mask (not illustrated). Then, the amorphous silicon film 25 is patterned by dry etching through the use of the mask into an island, as illustrated in FIG. 3E.

Then, a chromium film is formed by sputtering entirely over the product resulted from the above-mentioned steps.

Figure 3F:
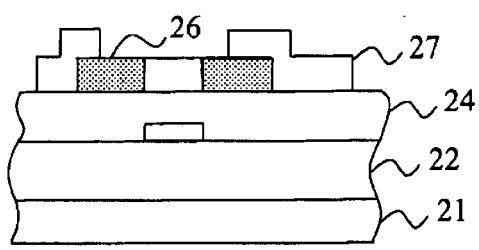

Then, photoresist is coated all over the chromium film, and then, the photoresist is patterned by photolithography to thereby form a mask (not illustrated). Then, the chromium film is patterned by dry etching through the mask to thereby form a metal wiring layer 27 through which the island-shaped amorphous silicon film 25 is exposed at its upper surface, as illustrated in FIG. 3F.

Then, an interlayer insulating film 28 composed of silicon dioxide is formed by sputtering all over the product resulted from the above-mentioned steps.

Figure 3G:
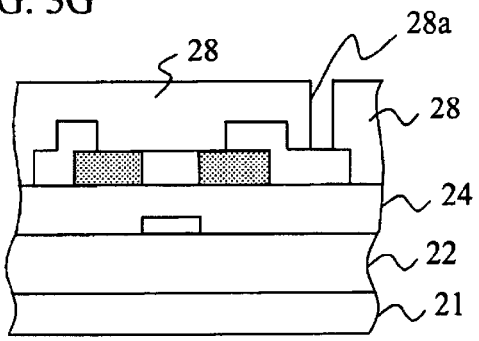

Then, photoresist is coated all over the interlayer insulating film 28, and then, the photoresist is patterned by photolithography and etching to thereby form a mask (not illustrated). Then, the interlayer insulating film 28 is patterned by dry etching through the mask to thereby form a contact hole 28a reaching the metal wiring layer 27, as illustrated in FIG. 3G.

Then, an electrically conductive film composed of electrically conductive transparent material such as indium-tin-oxide (ITO) is formed over the interlayer insulating film 28 by sputtering such that the contact hole 28a is filled with the electrically conductive film.

Figure 3H:
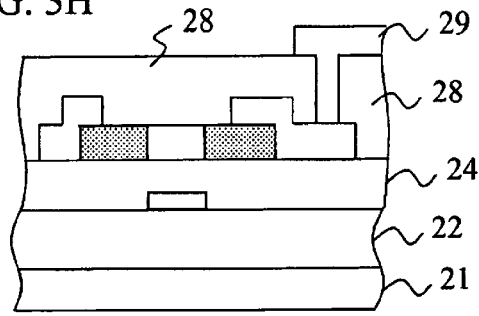

Then, photoresist is coated all over the electrically conductive transparent film, and then, the photoresist is patterned by photolithography and etching to thereby form a mask (not illustrated). Then, the electrically conductive transparent film is patterned by dry etching through the mask to thereby form a pixel electrode 29, as illustrated in FIG. 3H.

Then, a product resulted from the above-mentioned steps is annealed in order to reduce a contact resistance.

Figure 3I:
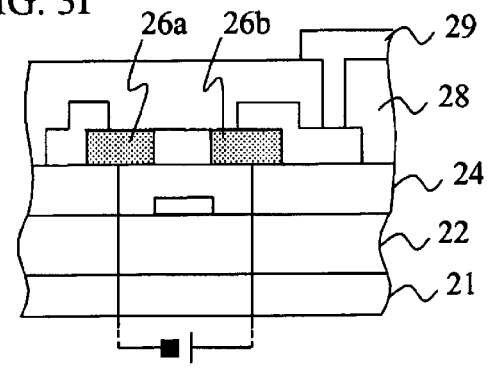

Then, as illustrated in FIG. 3I, an electric field is applied across a first impurity region 26a defining a drain of a thin film transistor and a second impurity region 26b defining a source of the thin film transistor. Specifically, two electrodes electrically connecting to a drain and a source of a thin film transistor are formed, and then, an electric field is applied across the electrodes.

A thin film transistor can have enhanced mobility by applying an electric field across a drain and a source.

Thus, a coplanar type thin film transistor composed of amorphous silicon having superior electric characteristics is formed on the resin substrate 21.

Then, an example of the method in accordance with the third embodiment is explained hereinbelow.

First, as illustrated in FIG. 3A, a silicon dioxide film 22 is formed as a cover film by sputtering on a resin substrate 21 composed of siloxane having a maximum resistance to heat of about 250 degrees centigrade. The silicon dioxide film 22 has a thickness of 2000 angstroms.

Then, a chromium film is formed entirely over the silicon dioxide film 22.

Then, the chromium film is patterned by photolithography and dry etching into an island-shaped gate electrode 23, as illustrated in FIG. 3A.

Then, as illustrated in FIG. 3B, a gate insulating film 24 composed of silicon nitride and an amorphous silicon film 25 as an active layer are successively formed on the silicon dioxide film 22 at 180 degrees centigrade by sputtering. The gate insulating film 24 and the amorphous silicon film 25 have thicknesses of 4500 and 800 angstroms, respectively.

Then, as illustrated in FIG. 3C, hydrogen ions are doped entirely into the amorphous silicon film 25.

The conditions for carrying out the hydrogen-ion-doping are as follows.

Acceleration voltage: 40 KeV
Doped hydrogen: $5 \times 10^{16}$ cm$^{-2}$

Then, a mask (not illustrated) is formed on the amorphous silicon film 25. Then, phosphorus (P) ions are doped into the amorphous silicon film 25 through the mask to form n-type impurity regions 26 in the amorphous silicon film 25, as illustrated in FIG. 3D.

The conditions for carrying out the phosphorus-ion-doping are as follows in order to allow phosphorus to be introduced only into the amorphous silicon film 25.

Acceleration voltage: 20 KeV
Doped phosphorus: $2 \times 10^{15}$ cm$^{-2}$

Then, the amorphous silicon film 25 including the impurity regions 26 is patterned by dry etching into an island, as illustrated in FIG. 3E.

Then, a chromium film is formed by sputtering entirely over the product resulted from the above-mentioned steps.

Then, the chromium film is patterned by dry etching to form a metal wiring layer 27 through which the island-shaped amorphous silicon film 25 is exposed at its upper surface, as illustrated in FIG. 3F.

Then, an interlayer insulating film 28 composed of silicon dioxide is formed all over the product resulted from the above-mentioned steps, by sputtering.

Then, the interlayer insulating film 28 is patterned by dry etching to thereby form a contact hole 28a reaching the metal wiring layer 27, as illustrated in FIG. 3G.

Then, an electrically conductive film composed of electrically conductive transparent material such as indium-tin-oxide (ITO) is formed over the interlayer insulating film 28 by sputtering such that the contact hole 28a is filled with the electrically conductive film.

Then, the electrically conductive transparent film is patterned by dry etching to thereby form a pixel electrode 29, as illustrated in FIG. 3H.

Then, the product resulted from the above-mentioned steps is annealed for an hour at 160 degrees centigrade in order to reduce a contact resistance.

The inventor observed how the thin film transistor worked at this stage. The result was that the thin film transistor did not work explicitly as a transistor, but worked as a resistor.

Thereafter, as illustrated in FIG. 3I, an electric field of 50V is applied across a first impurity region 26a defining a drain and a second impurity region 26b defining a source.

The inventor observed again how the thin film transistor worked at this stage. The thin film transistor worked explicitly as a transistor, and had mobility of 0.6 cm$^2$/Vs. That is, a transistor was completed by applying a voltage across a drain and a source of the thin film transistor.

The amorphous silicon film 25 had a hydrogen concentration of 10% after an electric filed was applied to the thin film transistor. A ratio of Si—H bondings in the contained hydrogen was equal to or greater than 90%.

In the methods in accordance with the above-mentioned first to third embodiments, laser beams are irradiated to an amorphous silicon film, or an electric field is applied to an amorphous silicon film both without necessity of thermal energy. That is, both of those steps can be carried out at room temperature. Accordingly, in accordance with the above-mentioned first to third embodiments, a resin substrate having a low maximum resistance to heat will never experience a temperature equal to or higher than the maximum resistance to heat, ensuring that a thin film transistor comprised of an amorphous silicon film can be formed on a resin substrate.

In addition, a liquid crystal display device including a thin film transistor fabricated in accordance with the above-mentioned first to third embodiments could be fabricated lighter and thinner.

The thin film transistor in accordance with the present invention may be applied to a light-transmission type liquid crystal display device in which a light emitted from a backlight device transmits through the liquid crystal display device, and defines a desired image on a display screen, a COT type liquid crystal display device or a light-reflection type liquid crystal display device in which a light entering the liquid crystal display device is reflected at a reflecting electrode, transmits through the liquid crystal display device again, and defines a desired image on a display screen.

Herein, a COT type liquid crystal display device indicates a liquid crystal display device in which a color filter is formed on a switching device.

In the above-mentioned first to third embodiments, only parts by which the present invention is characterized have been explained, and parts known to those skilled in the art were not explained in detail. However, it should be noted that even if they are not explained in detail, those skilled in the art could understand them readily.

In the specification, the term "resin substrate" indicates all forms to which a diode can be formed, as well as a plate-shaped substrate. For instance, a resin film is covered by the term "resin substrate".

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-111360 filed on Apr. 10, 2001 including specification, claims, drawings and summary is incorporated herein by reference in its entirety.

What is claimed is:

1. A method of fabricating a thin film transistor, comprising the steps of:
   (a) forming an amorphous silicon film containing hydrogen therein, on a substrate composed of resin; and
   (b) irradiating laser beams to said amorphous silicon film at an intensity smaller than a threshold intensity at which said amorphous silicon film is crystallized such that said amorphous silicon film is not crystallized, said amorphous silicon film being included as a layer in said thin film transistor, wherein laser beams are irradiated to said amorphous silicon film at an intensity between about 70% to about 95% of said threshold intensity.

2. The method as set forth in claim 1, wherein said step (a) includes the steps of: (a1) forming said amorphous silicon film on said resin substrate by sputtering; and (a2) doping hydrogen ions into said amorphous silicon film.

3. The method of claim 1, wherein said amorphous silicon film is formed by plasma enhanced chemical vapor deposition.

4. The method of claim 3, wherein said amorphous silicon film is formed at 200 degrees centigrade.

5. The method of claim 1, wherein said amorphous silicon film is formed on a gate insulating film and a channel protection film is formed on said amorphous silicon film.

6. The method of claim 5, wherein said gate insulating film, said channel protection film, and said amorphous silicon film are formed by plasma enhanced chemical vapor deposition.

7. The method of claim 5, wherein said laser beams are irradiated to said amorphous silicon film through said channel protection film.

8. The method of claim 7, further comprising: patterning said channel protection film into an island.

9. The method of claim 1, wherein said amorphous silicon film is formed on a gate insulating film.

10. The method of claim 9, further comprising:
    introducing hydrogen into said amorphous silicon film.

11. A method of fabricating a thin film transistor, comprising the steps of:
    (a) forming an amorphous silicon film containing hydrogen therein and acting as a channel region, on a substrate composed of resin; and
    (b) applying an electric field to said amorphous silicon film, wherein said amorphous silicon film includes a first impurity region defining a drain of said thin film transistor and a second impurity region defining a source of said thin film transistor, said drain and said source disposed within said amorphous silicon film.

12. The method as set forth in claim 11, wherein said step (a) includes the steps of:
    (a1) forming said amorphous silicon film on said resin substrate by sputtering; and
    (a2) doping hydrogen ions into said amorphous silicon film.

13. The method of claim 11, wherein said amorphous silicon film is formed on a gate insulating film.

14. The method of claim 11, further comprising:
    introducing hydrogen into said amorphous silicon film.

15. The method of claim 14, further comprising:
    doping impurity into said amorphous silicon film in a selected region to form an impurity-doped region including said first impurity region and said second impurity region.

16. The method of claim 15, further comprising:
    patterning said amorphous silicon film into an island such that said island includes said impurity-doped region.

17. A method of fabricating a thin film transistor, comprising the steps of:
    (a) forming an electrically insulating film on a substrate composed of resin;
    (b) forming a gate electrode on said electrically insulating film;
    (c) forming a gate insulating film on said electrically insulating film such that said gate electrode is entirely covered with said gate insulating film;

(d) forming a first amorphous silicon film on said gate insulating film;

(e) forming a channel-protection film on said first amorphous silicon film;

(f) irradiating laser beams to said first amorphous silicon film through said channel-protection film;

(g) pattering said channel-protection film into an island;

(h) forming a second amorphous silicon film on said first amorphous silicon film such that said channel-protection film is entirely covered with said second amorphous silicon film, said second amorphous silicon film containing impurity therein;

(i) patterning said second amorphous silicon film, said first amorphous silicon film and said gate insulating film into an island;

(j) forming a metal wiring layer around said second amorphous silicon film, said first amorphous silicon film and said gate insulating film such that the thus island-shaped second amorphous silicon film is partially exposed;

(k) partially removing said second amorphous silicon film with said metal wiring layer being used as a mask, to thereby expose said channel-protection film;

(l) forming an interlayer insulating film all over a product resulted from said step (k);

(m) forming said interlayer insulating film with a contact hole reaching said metal wiring layer; and (n) forming a metal film on said interlayer insulating film such that said contact hole is filled with said metal film, said metal film defining a pixel electrode.

18. A method of fabricating a thin film transistor, comprising the steps of:

(a) forming an electrically insulating film on a substrate composed of resin;

(b) forming a gate electrode on said electrically insulating film;

(c) forming a gate insulating film on said electrically insulating film such that said gate electrode is entirely covered with said gate insulating film;

(d) forming a first amorphous silicon film on said gate insulating film;

(e) introducing hydrogen into said first amorphous silicon film;

(f) doping impurity into said first amorphous silicon film in a selected region to thereby form an impurity-doped region;

(g) irradiating laser beams to said first amorphous silicon film;

(h) patterning said first amorphous silicon film into an island such that said island includes said impurity-doped region;

(i) forming a metal wiring layer such that said metal wiring layer makes contact with said first amorphous silicon film;

(j) forming an interlayer insulating film all over a product resulted from said step (i);

(k) forming said interlayer insulating film with a contact hole reaching said metal wiring layer; and (l) forming a metal film on said interlayer insulating film such that said contact hole is filled with said metal film, said metal film defining a pixel electrode.

19. A method of fabricating a thin film transistor, comprising the steps of:

(a) forming an electrically insulating film on a substrate composed of resin;

(b) forming a gate electrode on said electrically insulating film;

(c) forming a gate insulating film on said electrically insulating film such that said gate electrode is entirely covered with said gate insulating film;

(d) forming a first amorphous silicon film on said gate insulating film;

(e) introducing hydrogen into said first amorphous silicon film;

(f) doping impurity into said first amorphous silicon film in a selected region to thereby form an impurity-doped region;

(g) patterning said first amorphous silicon film into an island such that said island includes said impurity-doped region;

(h) forming a metal wiring layer such that said metal wiring layer makes contact with said first amorphous silicon film;

(i) forming an interlayer insulating film all over a product resulted from said step (h);

(j) forming said interlayer insulating film with a contact hole reaching said metal wiring layer;

(k) forming a metal film on said interlayer insulating film such that said contact hole is filled with said metal film, said metal film defining a pixel electrode; and (l) applying an electric field across an impurity-doped region which will make a source of said thin film transistor and an impurity-doped region which will make a drain of said thin film transistor.

20. A method of fabricating a thin film transistor, comprising:

(a) forming an amorphous silicon film containing hydrogen therein, on a substrate composed of resin;

(b) irradiating laser beams to said amorphous silicon film at an intensity smaller than a threshold intensity at which said amorphous silicon film is crystallized such that said amorphous silicon film is not crystallized, said amorphous silicon film being included as a layer in said thin film transistor;

wherein said amorphous silicon film is formed on a gate insulating film and a channel protection film is formed on said amorphous silicon film;

wherein said laser beams are irradiated to said amorphous silicon film through said channel protection film;

(c) patterning said channel protection film into an island;

wherein said amorphous silicon film is a first amorphous silicon film; and (d) forming a second amorphous silicon film on said first amorphous silicon film such that said channel protection film is entirely covered with said second amorphous silicon film.

21. The method of claim 20, further comprising:

patterning said second amorphous silicon film, said first amorphous silicon film and said gate insulating film into an island.

22. The method of claim 21, further comprising:

forming a metal wiring around said second amorphous silicon film, said first amorphous silicon film and said gate insulating film such that the thus island-shaped second amorphous silicon film is partially exposed.

23. The method of claim 22, further comprising:
partially removing said second amorphous silicon film with said metal wiring layer used as a mask to expose said channel protection film.

24. The method of claim 23, further comprising:
forming an interlayer insulating film all over a product resulted from said partially removing.

25. The method of claim 24, further comprising:
forming said interlayer insulating film with a contact hole reaching said metal wiring layer.

26. The method of claim 25, further comprising:
forming a metal film on said interlayer insulating film such that said contact hole is filled with said metal film, said metal film defining a pixel electrode.

27. A method of fabricating a thin film transistor, comprising:
(a) forming an amorphous silicon film containing hydrogen therein, on a substrate composed of resin;
(b) irradiating laser beams to said amorphous silicon film at an intensity smaller than a threshold intensity at which said amorphous silicon film is crystallized such that said amorphous silicon film is not crystallized, said amorphous silicon film being included as a layer in said thin film transistor, wherein said amorphous silicon film is formed on a gate insulating film;
(c) introducing hydrogen into said amorphous silicon film; and
(d) doping impurity into said amorphous silicon film in a selected region to form an impurity-doped region and wherein said irradiating is performed after said doping.

28. The method of claim 27, further comprising:
pattering said amorphous silicon film into an island such that said island includes said impurity-doped region.

29. The method of claim 28, further comprising:
forming a metal wiring layer such that said metal wiring layer makes contact with said amorphous silicon film.

30. The method of claim 29, further comprising:
forming an interlayer insulating film all over a product resulted from said forming a metal wiring layer.

31. The method of claim 30, further comprising:
forming said interlayer insulating film with a contact hole reaching said metal wiring layer.

32. The method of claim 31, further comprising:
forming a metal film on said interlayer insulating film such that said contact hole is filled with said metal film, said metal film defining a pixel electrode.

33. A method of fabricating a thin film transistor, comprising:
forming an amorphous silicon film containing hydrogen therein, on a substrate composed of resin; and
applying an electric field to said amorphous silicon film including a first impurity region defining a drain of said thin film transistor and a second impurity region defining a source of said thin film transistor, said drain and said source disposed within said amorphous silicon film;
introducing hydrogen into said amorphous silicon film;
doping impurity into said amorphous silicon film in a selected region to form an impurity-doped region including said first impurity region and said second impurity region;
patterning said amorphous silicon film into an island such that said island includes at least one of said first impurity-doped region and said second impurity-doped region; and
forming a metal wiring layer such that said metal wiring layer makes contact with said amorphous silicon film.

34. The method of claim 33, further comprising:
forming an interlayer insulating film all over a product resulted from said forming a metal wiring layer.

35. The method of claim 34, further comprising:
forming said interlayer insulating film with a contact hole reaching said metal wiring layer.

36. The method of claim 35, further comprising:
forming a metal film on said interlayer insulating film such that said contact hole is filled with said metal film, said metal film defining a pixel electrode.

* * * * *